ALLOY-JUNCTION SEMICONDUCTORS AND METHOD FOR MAKING THE SAME

Filed Jan. 26, 1959

INVENTOR.
SHELDON L. MATLOW
BY
Bruce L. Birchard
ATTORNEY 3,124,493

ALLOY-JUNCTION SEMICONDUCTORS AND METHOD FOR MAKING THE SAME

Sheldon L. Matlow, Chicago, Ill., assignor to Hoffman Electronics Corporation, a corporation of California Filed Jan. 26, 1959, Ser. No. 788,808
5 Claims. (Cl. 148—178)

The present invention relates to alloy junctions in semiconductor devices and, more particularly, to the composition of the alloying material for a particular semiconductor material and to the method of making the alloy junction.

One of the problems involved in the manufacture of semiconductor devices having alloy junctions has been the large number of rejects because of mechanical weaknesses at the junctions and consequent electrical open-circuits. For this reason, the present methods used in the manufacture of silicon semiconductor devices having aluminum alloy junctions are largely unsatisfactory. An important factor in the mechanical strength and stability of a junction is the extent of junction area remaining after the etching step in the process of manufacturing. Metallographic studies show that the aluminum-silicon region is strongly angular. From the geometry of the aluminum-silicon region, it is apparent that the angularity results from the molten aluminum etching the silicon, according to the Miller index notation, along the (1 1 1) crystal planes. If the junction is permitted to remain along the (1 1 1) crystal planes, the Zener breakdown will occur at that portion of the junction. In such a case, the Zener voltage level referred to as the first plateau will be undesirably low. Therefore, it is desirable to etch away the silicon beyond the corners of the intersections of the (1 1 1) planes until that portion of the junction region is reached which yields a higher Zener breakdown voltage level, referred to as the second plateau. This extensive etching process leaves very little silicon in the junction region, thus tending to render the junction mechanically unstable and weak.

It is an object of the present invention, therefore, to provide a mechanically strong alloy junction in a semiconductor device.

It is another object of the present invention to provide a mechanically strong alloy junction in a semiconductor device having a high Zener breakdown voltage.

It is a further object of the present invention to reduce the etching time required to obtain a high Zener voltage level for an alloy-junction semiconductor device.

According to the present invention, an alloy-junction semiconductor device comprises a P-portion formed by aluminum doped with boron in a concentration of from approximately .25% to approximately 2%, and an etched N-silicon body portion.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which, FIGURE 1 is a plan view of a boron-doped aluminum wire alloyed into a silicon body.

Figure 1:
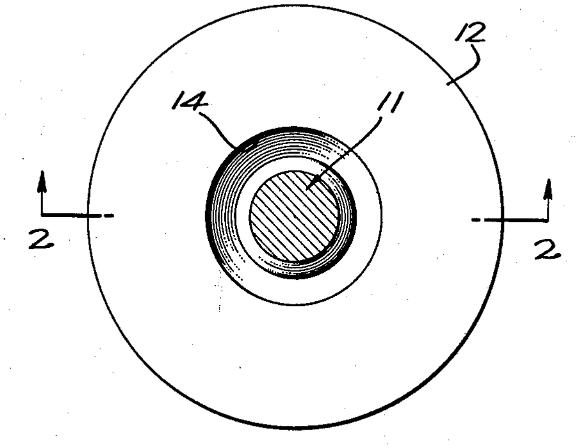
Figure 2:
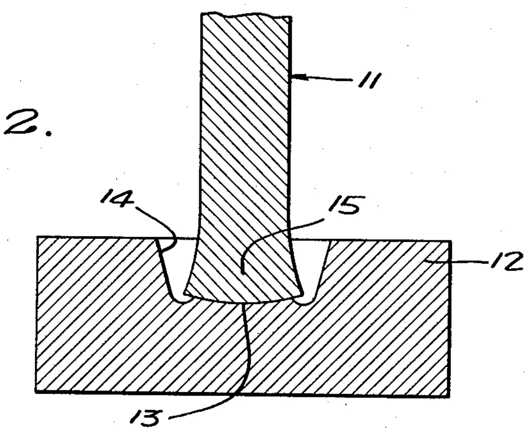
FIGURE 2 is a sectional view taken along line 2—2 of FIGURE 1.

Referring now to the drawings, FIGURES 1 and 2 show wire 11 and body 12 forming an alloy junction semiconductor device. Wire 11 is composed of aluminum doped with boron in a concentration of between approximately .25% and 2%. Body 12 is composed of silicon having N-type conductivity. Junction 13 is the only common surface between wire 11 and body 12. Surface 14 of body 12 is obtained after body 12 is etched to restrict contact between wire 11 and body 12 to junction 13.

In order to obtain the alloy junction of the semiconductor device shown in FIGURES 1 and 2, one end of wire 11 is pressed against body 12, which is heated to the melting temperature of wire 11. The pressure and heat are maintained while end 15 of boron-doped aluminum wire 11 melts and forms a eutectic solution with a portion of silicon body 12. Wire 11 and body 12 are then cooled to permit the recrystallization of the diffused portion into a single silicon crystal doped with aluminum and boron and the creation of a P-N junction between end 15 and body 12. Body 12 may then be etched to restrict contact between wire 11 and body 12 to the P-N junction.

It is hypothesized that there are two phenomena involved in the alloying. The first phenomenon is one of solution in which atoms of the liquid phase attack surface atoms of the solid phase and form weak bonds with the atoms of the solid phase. The surface atoms which are weakly bonded will then break away singly from the surface and enter the liquid phase. This means that the atoms remaining on the surface will lie along the plane of strongest bonding, which in the case of silicon is the (1 1 1) plane.

In the second phenomenon, an atom from the liquid phase enters into the lattice and perturbs the crystal field in that region. As a result of the perturbation and the thermal energy available, the region becomes disorganized and mixes with the liquid phase. The geometry in this case is determined by the ability of the liquid phase to wet and enter the solid phase and tends to be hemispherical.

The first phenomenon predominates in a silicon-poor eutectic system whereas the second phenomenon predominates in a silicon-rich eutectic system. Thus, the (1 1 1) plane can be eliminated by doping the aluminum so as to make the eutectic with silicon richer in silicon. Boron is the only group III element having a melting point high enough to yield a eutectic richer in silicon. When the aluminum is doped with boron, the resulting eutectic is richer in silicon and the geometry is hemispherical.

Figure 3:
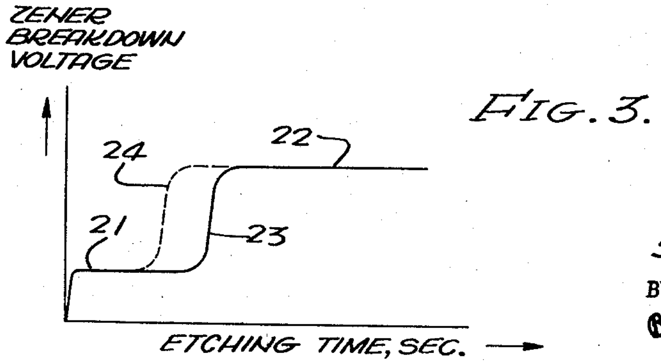
FIGURE 3 is a graph of Zener breakdown voltage versus etching time.

FIGURE 3 is a graph of Zener breakdown voltage versus etching time, for an aluminum wire. Curve 21 is called the first plateau and curve 22 is called the second plateau. The second plateau must be reached in order to obtain a high Zener breakdown voltage. But the longer the etching time, the weaker is the mechanical junction between the wire and the semiconductor body. When the wire is made of boron-doped aluminum, curve 23 is shifted to the left, as shown by dotted line 24. That is, the second plateau is recahed in a shorter etching time when the geometry of the wire is hemispherical than when it is along the (1 1 1) plane, and the junction between silicon body 12 and boron-doped aluminum wire 11 of FIGURES 1 and 2 is much stronger than it would be in the absence of boron. It has been found that boron in a concentration of between approximately .25% and 2% yields the best results.

While particular embodiments of the present invention have been shown and described, it will be obvious to those skilled in the art that changes and modifications may be made without departing from this invention in its broader aspects, and, therefore, the aim in the appended claims is to cover all such changes and modificaitons as fall within the true spirit and scope of this invention.

What I claim as my invention is:

1. A method of making an alloy-junction semiconductor comprising the steps of: heating both a semiconductor body composed of silicon having N-type conductivity and a lead composed of aluminum doped with boron in a concentration of between approximately .25% and 2%; pressing said body and an end of said lead together; maintaining sufficient pressure and heat until diffusion occurs between said silicon body and said boron-doped aluminum lead at the place of contact; cooling said body and said lead to obtain recrystallization of said diffused portion and the creation of a P-N junction between said lead end and said body; and etching said body at said place of contact to restrict contact between said lead and said body to solely said P-N junction.

2. A method of making an alloy-junction semiconductor, comprising the steps of: pressing an end of a lead comprising aluminum doped with boron in a concentration of between approximately .25% and 2% against a semiconductor body comprising silicon having N-type conductivity; heating said body until said lead end melts and forms a eutectic solution with a portion of said silicon; cooling said body and said lead to obtain recrystallization of the diffused portion and the creation of a P-N junction within said body in close proximity to said lead; and etching said body to restrict contact between said lead and said body to solely said P-N junction.

3. An alloy-junction semiconductor comprising a silicon semiconductor body having N-type conductivity, and an aluminum lead doped with boron in a concentration of from approximately .25% to approximately 2%, one end of said lead being diffused into said body to form a P-N junction, and said body being etched in the vicinity of said diffused end to restrict contact between said lead and said body to said P-N junction.

4. An alloy-junction semiconductor comprising: a body portion of silicon material doped with an electron donor activating substance so as to constitute said body portion an N-type semiconductor material; and an aluminum wire doped with boron in the range of approximately .25% to 2%, one end of said wire being diffused into said body portion to form a P-N junction, and said body portion being etched in the vicinity of said diffused end portion to form a P-N junction, and contact between said wire and said body being restricted to solely said P-N junction.

5. The process of making an alloy-junction semiconductor, comprising the steps of: pressing an end of a wire consisting of aluminum doped with boron in a concentration of from approximately .25% to approximately 2% against a body consisting of silicon having N-type conductivity and heating said body at least to the melting temperature of said wire; maintaining said temperature while said wire end melts and forms a eutectic solution with a portion of said silicon; cooling said body to permit single-crystal recrystallization of said solution and the creation of a P-N junction between said wire end and said body; and etching said body to restrict contact between said wire and said body to solely said P-N junction.

References Cited in the file of this patent

UNITED STATES PATENTS

| | | |
|---|---|---|
| 2,697,269 | Fuller | Dec. 21, 1954 |
| 2,783,197 | Herbert | Feb. 20, 1957 |
| 2,792,538 | Pfann | May 14, 1957 |
| 2,805,370 | Wilson | Sept. 3, 1957 |
| 2,817,798 | Jenny | Dec. 24, 1957 |
| 2,829,999 | Gudmundsen | Apr. 8, 1958 |
| 2,833,969 | Christian | May 6, 1958 |
| 2,878,147 | Beale | Mar. 17, 1959 |
| 2,894,862 | Mueller | July 14, 1959 |
| 2,919,386 | Ross | Dec. 29, 1959 |